United States Patent [19]

Gouldy et al.

[11] Patent Number: 4,802,859
[45] Date of Patent: Feb. 7, 1989

[54] ELECTRICAL CONNECTOR

[75] Inventors: Thomas E. Gouldy, South Williamsport; William C. Knoll, Turbotville; Ernest R. Ritter, deceased, late of Lewisburg, by Faye E. Ritter, executrix; Thomas M. Lynch, Williamsport; Ronald E. Steffey, Cochranton, all of Pa.; Donald R. White, Warwich, R.I.; Robert E. Brown, Stratham, N.H.

[73] Assignee: GTE Products Corporation, Stamford, Conn.

[21] Appl. No.: 176,502

[22] Filed: Apr. 1, 1988

[51] Int. Cl.[4] .............................. H01R 9/09
[52] U.S. Cl. .................................... 439/74
[58] Field of Search .............. 439/65, 69, 74, 629–637

[56] References Cited

U.S. PATENT DOCUMENTS 3,558,994  1/1971  Bernstein ........................ 439/74
3,638,033  1/1972  Johnson et al. .
4,289,364  9/1981  Strom et al. .
4,647,126  3/1987  Sobata, Jr. ...................... 439/74

Primary Examiner—Joseph H. McGlynn
Attorney, Agent, or Firm—William H. McNeill

[57] ABSTRACT

An electrical connecting device for use with a multiple layered circuit-containing device wherein at least two layers of the multiple layered circuit-containing device each contain a circuit including a plurality of circuit contacts to be electrically connected by the electrical connecting device. The electrical connecting device includes an upper longitudinal peripheral surface joined to a lower longitudinal peripheral surface by an intermediate longitudinal surface to form an elongated member which has a Z-shaped configuration in cross section and is formed from a plurality of Z-shaped connectors shaped from each other in a predetermined amount to effect a moiré pattern when superimposed relative to the circuit contacts of at least one of the layers.

15 Claims, 2 Drawing Sheets

ELECTRICAL CONNECTOR

BACKGROUND OF THE INVENTION

1. Field of the Invention

The present invention relates to an electrical connector for use with a multiple layered circuit-containing device and to a method of assembly of such a device.

2. Description of Prior Art

Compact display devices are known which utilize crossed electrical conductive members. In such devices, by energizing two particular conductors the point at which such conductors cross causes a luminescent media to be excited to cause luminescence at that point. By the proper sequence of energizing the conductors a display appears to the eye in the form of pictures, numbers, etc. Examples of known compact display devices are described in U.S. Pat. Nos. 3,638,033 and 4,289,364. Such compact display devices occupy much less space than the more bulky cathode ray-type devices, and consequently the spacing of the conductive members and electrical connectors associated therewith is more minute. Heretofore, known means of connecting such conductive members have included the use of individual wires bonded from one conductive member of pad such as might be associated with a display glass to another conductive member or pad such as might be associated with a related printed circuit board. Another known connector is an elastomeric connector in the form of a ribbon cable. One problem associated with prior art connectors is the difficulty in properly aligning the connector with the conductive members to be electricially connected. A further problem has been the difficulty in visually inspecting to assure proper alignment. In addition, soldering the individual connections is a time consuming procedure. Further, electrical testing of the fully assembled device is time consuming.

It is highly desirable to provide an electrical connecting device for electrically connecting conductive members of a multiple layered circuit-containing device using a unitary strip member including a plurality of electrical connectors which can be simultaneously soldered to appropriate conductive members.

It is further desirable to provide such an electrical connecting device which provides for ease of alignment of individual electrical connectors and the appropriate conductive members by a visual awareness of alignment, or non-alignment, relying upon what is known as a moiré pattern.

It is also desirable to provide such an electrical connecting device which provides for ease of inspection by visual awareness of alignment, or non-alignment, relying upon a moiré pattern.

It is further desirable to provide such an electrical connecting device which allows for electrically testing after assembly of the device without the need for testing each individual connection.

It is also desirable to provide such an electrical connecting device which allows for adjusting improperly aligned electrical connector-conductive material interfaces in a single operation rather than adjusting each interface individually.

It is desirable to provide such an electrical connecting device which can be easily manufactured.

SUMMARY OF THE INVENTION

This invention achieves these and other results by providing an electrical connecting device for use with a multiple layered circuit-containing device wherein at least two layers of the multiple layered circuit-containing device each contain a circuit including circuit contacts to be electrically connected from layer to layer by the electrical connecting device. The electrical connecting device comprises an upper longitudinal peripheral surface joined to a lower longitudinal peripheral surface by an intermediate longitudinal surface to form an elongated member having a longitudinal direction, a transverse direction and a Z-like configuration when viewing a transverse cross-section of the elongated member. A row of elongated apertures is also provided in the intermediate longitudinal surface, the row extending in such longitudinal direction. Each elongated aperture in the row of elongated apertures extends in such transverse direction and is spaced in the longitudinal direction from an adjacent elongated aperture by a Z-shaped electrical connector of electrically conductive material formed by the intermediate longitudinal surface. Each elongated aperture is spaced in such longitudinal direction from an adjacent elongated aperture in a predetermined amount to effect a moiré pattern when superimposed relative to the circuit contacts of at least one of the layers. A moiré pattern is effected, for example, in those instances where the circuit contacts and electrical connectors superimposed thereon are each in the form of a geometrical regular pattern such as a plurality of parallel members.

DESCRIPTION OF THE PREFERRED EMBODIMENT

Figure 1:
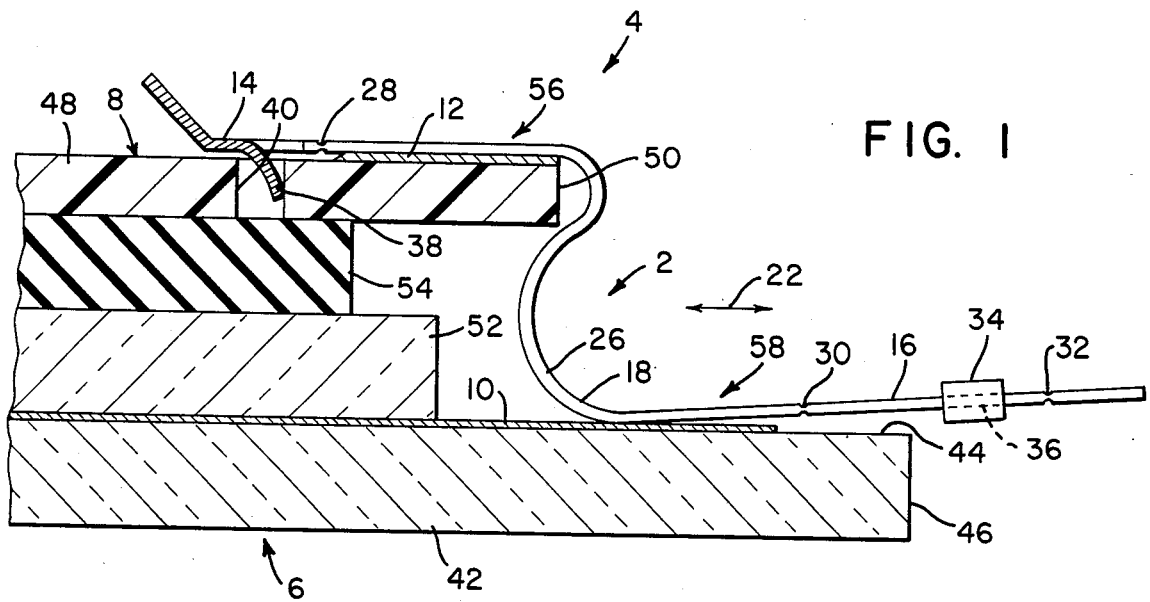
FIG. 1 is a perspective view in cross section of a multiple layered circuit-containing device including one embodiment of an electrical connecting device of the present invention.

The electrical connecting device of the present invention is particularly useful in a multiple layered circuit-containing device such as a visual display device of the type known in the art comprising a first grid structure including a plurality of parallel elongated, electrically-conductive electrically-individual spaced first elements and a second grid structure including a plurality of parallell elongated, electrically-conductive electrically-individual spaced second elements. Such first elements are oriented normal to such second elements and positioned in opposing relation thereto but spaced therefrom by an electrically luminescent medium positioned between such first and second grid structures. In such a known visual display device a printed circuit board is provided having a circuitry side including circuitry and electrically-conductive spaced members which form spaced contact surfaces. Electrical connecting devices are provided extending from the spaced contact surfaces of the printed circuit board to corresponding first and second element of the respective first and second grid structures. The present invention relates to the electrical connecting device for use with, for example, such a multiple layered circuit containing device and a method of assembling such a multiple layered circuit containing device. The discussion herein is directed to an electrical connecting device for use broadly with such a multiple layered circuit-containing device wherein for the sake of clarity only one group of elements of a grid structure is depicted in the drawing. However, it will be apparent to those skilled in the art that the present electrical connecting device can be used with visual display devices which include first and second grid structures as described above.

The embodiment of this invention which is illustrated in the drawings is particularly suited for achieving the objects of this invention. FIG. 1 depicts an electrical connecting device 2 for use with a multiple layered circuit-containing device 4 wherein at least two layers 6 and 8 each contain a circuit including circuit contacts 10 and 12 to be electrically connected from layer to layer by the electrical connecting device 2. The electrical connecting device 2 includes an upper longitudinal peripheral surface 14 joined to a lower longitudinal peripheral surface 16 by an intermediate longitudinal surface 18 to form an elongated member having a longitudinal direction 20, a transverse direction 22, and a Z-like configuration as depicted in FIG. 1 when viewing a transverse cross-section of the elongated member.

Figure 2:
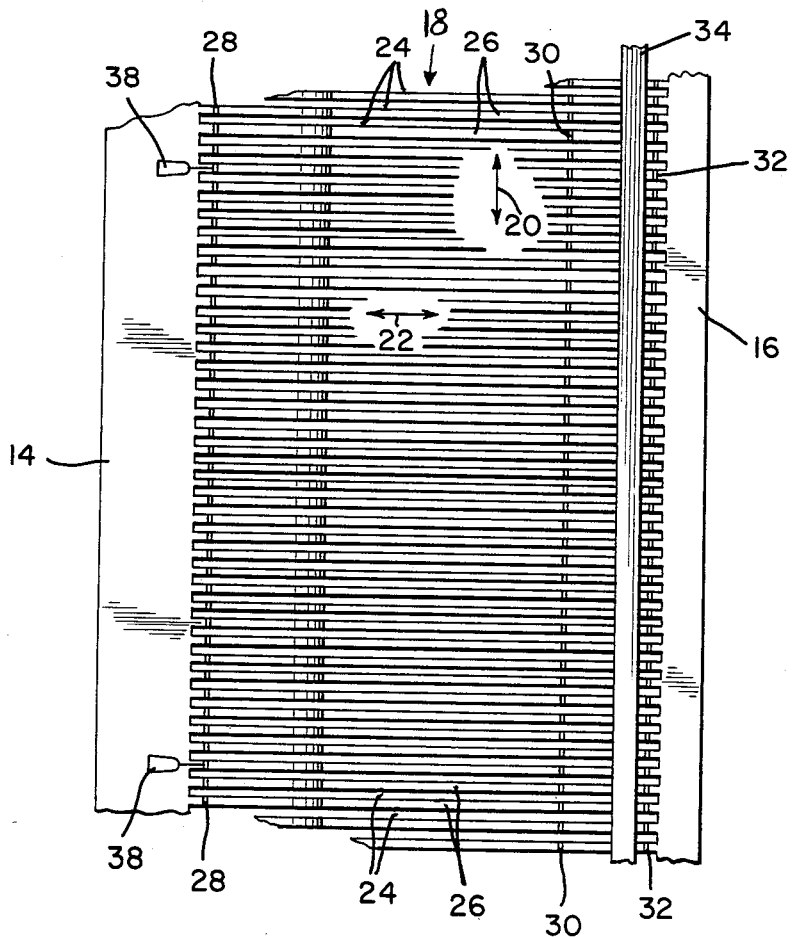
FIG. 2 is a plan view of the electrical connecting device of FIG. 1.

A row of elongated apertures 24 is provided in the intermediate longitudinal surface 18, such row extending in the longitudinal direction 20 as depicted in FIG. 2. Each elongated aperture 24 extends in the transverse direction 22 and is spaced in the longitudinal direction 20 from an adjacent elongated aperture 24 by a Z-shaped connector 26 of electrically conductive material extending from the upper longitudinal peripheral surface 14 to the lower longitudinal peripheral surface 16. As a practical matter, the intermediate longitudinal surface 18 comprises a plurality of the Z-shaped electrical connectors 26. Each elongated aperture 24 is spaced in the longitudinal direction 20 from an adjacent elongated aperture 24 in a predetermined amount to effect a moiré pattern relative to the circuit contacts of at least one of the layers when being aligned as described herein. In the preferred embodiment, each Z-shaped connector 26 is resilient. In one example, the width of the connectors 26 is 0.015 inches and the width of the elongated apertures 24 is also 0.015 inches.

In the preferred embodiment, the electrical connecting device includes at least one break-away portion extending in the longitudinal direction and intersecting each Z-shaped connector. For example, in the embodiment of FIGS. 1 and 2, electrical connecting device 2 includes three break-away portions each extending in the longitudinal direction 20 and each intersecting each Z-shaped connector 26. In particular, the upper longitudinal peripheral surface 14 includes a first break-away portion 28 and the lower longitudinal peripheral surface 16 includes a second break-away portion 30 and a third break-away portion 32. Preferably, such break-away portions are formed by embossing so that when the Z-shaped connectors 26 of the electrical connecting device 2 have been soldered to respective circuit contacts 10 and 12, the upper longitudinal peripheral surface 14 can be broken off from the assembly at breakaway 28 and the lower longitudinal peripheral surface 16 can be broken off from the assembly at breakaway 30 or 32, as desired.

Preferably the electrical connecting device 2 is stamped from an electrically conductive material and is solder plated in order to facilitate its use in electrically coupling circuit contacts 10 and 12.

In the preferred embodiment electrical connecting device 2 includes at least one carrier which extends in longitudinal direction 20. The carrier comprises an elongated member 34 having an elongated opening 36 extending therethrough through which a surface of the electrical connector extends. For example, in the drawings the lower longitudinal peripheral surface 16 extends through elongated opening 36 of the carrier. Preferably, the carrier is a plastic material.

In order to properly locate the electrical connecting device 2 vis-a-vis circuit contacts 12 of the layer 8 the upper longitudinal peripheral surface 14 includes a plurality of locating tabs 38 extending therefrom. As can be seen in FIG. 1, tabs 38 extend into a respective aperture 40 of layer 8.

FIG. 1 depicts a first grid structure of a known visual display device of the type discussed above, the second grid structure being omitted from the drawings for the purposes of clarity. In FIG. 1, the layer 6 represents the first grid structure and comprises an electrically insulative first base 42 having a plurality of parallel elongated, electrically-conductive, electrical-individual spaced first elements such as circuit contacts 10 on a conductive side 44 of the first base 42. Each circuit contact 10 extends towards at least a first edge 46 of the first base 42, the circuit contacts 10 being spaced from each other in the longitudinal direction 20, a predetermined distance along the periphery of the first base 42. The first base 42 is in the form of a display glass. The layer 8 is a printed circuit board having a circuitry side 48 including circuitry (not shown) and electrically-conductive spaced members in the form of circuit contacts 12 extending from the circuitry towards an edge 50 of the printed circuit board to form a plurality of contact surfaces. In the embodiment of FIG. 1, the intermediate layer 52 is the base for the second grid structure and the intermediate layer 54 serves as a shock absorber.

The spaced circuit contacts 12 of the printed circuit board are electrically connected to the spaced circuit contacts 10 of the first base 42 by means of the electrical connecting device 2 of the present invention. By spacing the distance between elongated apertures 24 in an amount equal to the spacing between circuit contacts 10 in the longitudinal direction 20 it is possible to properly align the Z-shaped connectors 26 with respective circuit contacts 10 as discussed herein.

Figure 3A:
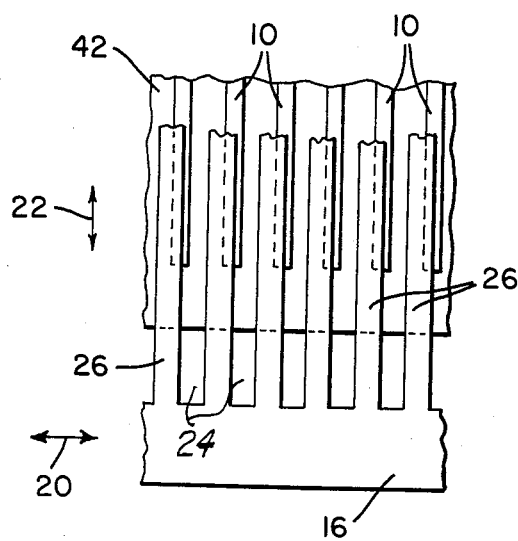
FIGS. 3A to 3C are enlarged views of a portion of the device of FIG. 1.
Figure 3B:
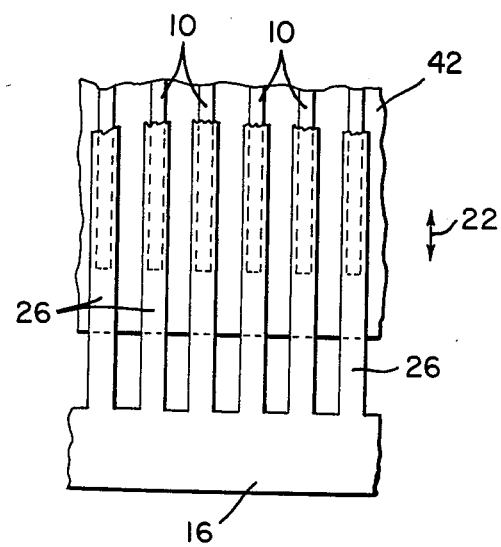
Figure 3C:
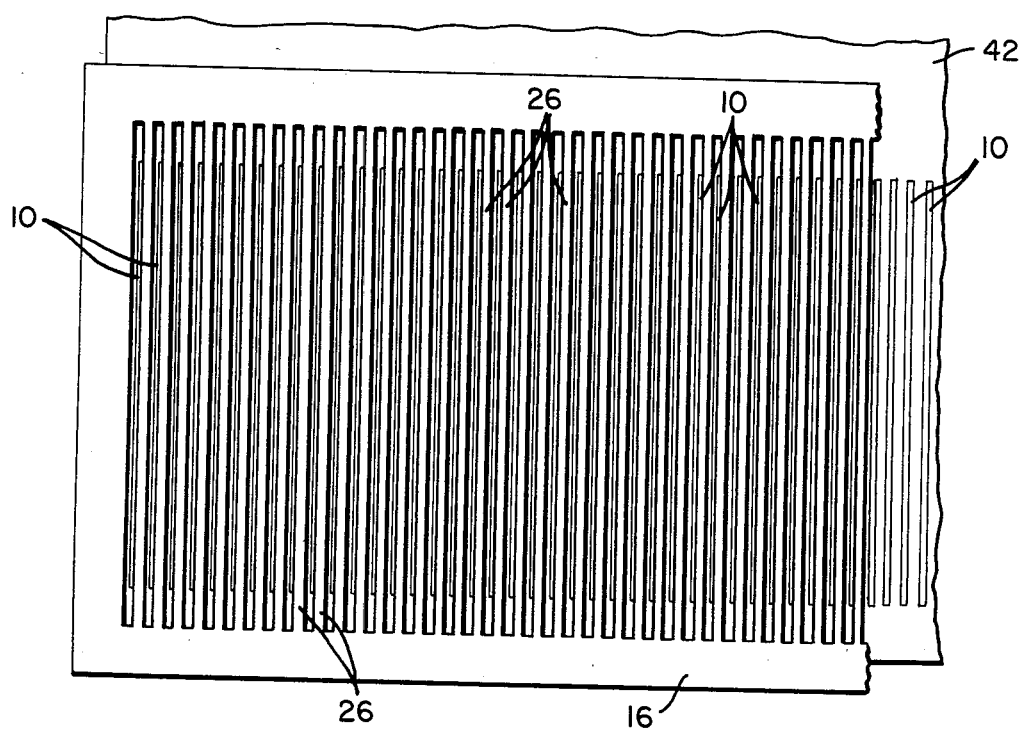

In the method of the present invention, the electrical connecting device 2 is positioned such that one end 56 of select electrical connectors 26 engages respective select first circuit contacts 12. The opposite end 58 of select electrical connectors 26 is superimposed upon select second circuit contacts 10 so that surface 44 of layer 6 can be seen through apertures 24 as depicted in FIGS. 3A and 3C and so that the plurality of electrical connectors 26 and apertures 24 therebetween, on the one hand, and the plurality of second circuit contacts 10 and spaces therebetween, on the other, give the appearance of a moiré pattern. In other words, a shimmering pattern is seen resulting from superimposing the two geometrically regular patterns effected by the plurality of spaced electrical connectors 26 and the plurality of spaced second circuit contacts 10. The electrical connecting device 2 is then shifted relative to the layer 6 in the longitudinal direction 20 until the electrical connectors 26 and second circuit contacts 10 are in alignment, as depicted in FIG. 3B, and the moiré pattern disappears. The select electrical connectors are then soldered to the select first circuit contacts and select second circuit contacts. For example, the device can be soldered by what is known in the art as hot bar reflow soldering.

In the method of the preferred embodiment the electrical connecting device 2 is positioned relative to the printed circiut board 8 such that the locating tabs 38 of the electrical connecting device 2 are positioned into respective apertures 40 of the printed circuit board to properly align the circuit contacts 12 with respective Z-shaped connectors 26. When the electrical connecting device 2 is in such position it will be positioned over the peripheral portion of layer 6 near edge 46 as depicted in FIG. 1 so that such peripheral portion and the circuit contacts 10 can be seen through the elongated apertures 24 thereby effecting a moiré pattern between the elongated apertures 24 and the Z-shaped connectors 26, on the one hand, and the spaced circuit contacts 10 and portions of the base 6 between such spaced circuit contacts, on the other. Subsequently, the electrical connector 2 is shifted relative to base 6 in the longitudinal direction 20 until the moiré pattern disappears at which point respective Z-shaped connectors will be properly aligned with respective circuit contacts 10. To this end the locating tabs 38 are sized relative to apertures 40 to allow such movement. When proper alignment is attained, such Z-shaped connectors 26 are soldered to such respective circuit contacts 10 and to the appropriate circuit contacts 12 on the printed circuit board or layer 8. During this procedure the plastic carrier 34 provides a convenient area to grasp during the process and also tends to hold the various Z-shaped connectors in place until soldering is effected. After the soldering operation the upper longitudinal peripheral surface 14 and lower longitudinal peripheral surface 16 is broken off at break-away portions 28 and 30.

It will be noted that the electrical connecting device 2 is a unitary strip-like member including the plurality of electrical connectors 26. With such a strip-like member the electrical connectors can be simultaneously soldered. Alignment and non-alignment of the individual electrical connectors with the appropriate conductive members at layer 6 can be determined visually by observing the moiré pattern effected as noted above. In a like manner inspection is facilitated in that the moiré pattern will not be present if there is proper alignment. The assembled device 4 can be electrically tested without the need for testing each individual connection, and improperly aligned electrical connector-circuit contact interfaces can be re-aligned in a single operation, rather than by adjusting each interface individually, merely by grasping the carrier 34 and moving the electrical connecting device 2 in the direction 20 as needed. The electrical connecting device 2 can be easily produced by, for example, stamping an electrically conductive sheet-like material in a known manner to obtain the device of the present invention.

The embodiments which have been described herein are but some of several which utilize this invention and are set forth here by way of illustration but not of limitation. It is apparent that many other embodiments which will be readily apparent to those skilled in the art may be made without departing materially from the spirit and scope of this invention.

We claim:

1. An electrical connecting device for use with a multiple layered circuit-containing device wherein at least two layers of said multiple layered circuit-containing device each contain a circuit including circuit contacts to be electrically connected from layer to layer by said electrical connecting device, said electrical connecting device comprising:

an upper longitudinal peripheral surface joined to a lower longitudinal peripheral surface by an intermediate longitudinal surface to form an elongated member having a longitudinal direction, a transverse direction and a Z-like configuration when viewing a transverse cross-section of said elongated member, a row of elongated apertures being provided in said intermediate longitudinal surface, said row extending in said longitudinal direction, and each elongated aperture in said row of elongated apertures extending in said transverse direction and being spaced in the longitudinal direction from an adjacent elongated aperture by a Z-shaped connector of electrically conductive material formed by said intermediate longitudinal surface, each elongated aperture being spaced in said longitudinal direction from an adjacent elongated aperture in a predetermined amount to effect a moiré pattern when superimposed relative to said circuit contacts of at least one layer of said at least two layers.

2. The electrical connecting device of claim 1 wherein each Z-shaped connector is resilient.

3. The electrical connecting device of claim 2 including at least one break-away portion extending in said longitudinal direction and intersecting each Z-shaped connector.

4. The electrical connecting device of claim 3 wherein said electrical connector is solder plated.

5. The electrical connecting device of claim 4 wherein said upper longitudinal peripheral surface includes a first of said break-away portions and said lower longitudinal peripheral surface includes a second of said break-away portions.

6. The electrical connecting device of claim 5 wherein said break-away portions are embossed.

7. The electrical connecting device of claim 4 further including at least one carrier extending in said longitudinal direction, said carrier comprising an elongated member having an elongated opening extending therethrough through which a surface of said electrical connector extends.

8. The electrical connecting device of claim 7 wherein said carrier is a plastic material.

9. The electrical connecting device of claim 4 wherein said upper longitudinal peripheral surface includes a plurality of locating tabs extending therefrom.

10. The electrical connecting device of claim 6 wherein said upper longitudinal peripheral surface includes a plurality of locating tabs extending therefrom.

11. The electrical connecting device of claim 8 wherein said upper longitudinal peripheral surface includes a plurality of locating tabs extending therefrom.

12. A method of electrically connecting contacts of one layer of a multiple layered circuit-containing device with contacts of another layer of said multiple layered circuit-containing device, said multiple layered circuit-containing device including at least a first layer including a plurality of electrically conductive first contacts forming a first row extending in a first direction and having first spaces therebetween, and at least a second layer including a plurality of electrically conductive second contacts forming a second row extending in said first direction and having second spaces therebetween, and an electrical connecting device including a plurality of electrically conductive electrical connectors forming a third row extending in said first direction and having apertures therebetween, said method comprising the steps of positioning said electrical connecting device such that one end of select electrical connectors of said plurality of electrical connectors engages respective select first contacts, superimposing an opposite end of select electrical connectors of said plurality of electrical connectors upon select of said second contacts so that said at least a second layer can be seen through said apertures and so that said plurality of electrical connectors and said apertures therebetween, on the one hand, and said plurality of second contacts and said second spaces therebetween, on the other, give the appearance of a moiré pattern, shifting said electrical connecting device reltaive to said at least a second layer along said first direction until said opposite end of said select electrical connectors, of said plurality of electrical connectors, and said select second contacts are in alignment and said moiré pattern disappears, and soldering said one end of said select electrical connectors of said plurality of electrical connectors to said respective select first contacts and said opposite end of said select electrical connectors of said pluraltiy of electrical connectors to said select of said second contacts.

13. The method of claim 12 wherein said electrical connecting device includes a plurality of locating tabs spaced in said first direction adjacent said one end of select electrical connectors of said plurality of electrical connectors and said at least a first layer includes a plurality of corresponding openings spaced in said first direction, and further including the step of inserting locating tabs of said plurality of locating tabs into respective openings of said plurality of corresponding openings during said positioning of said electrical connecting device.

14. The method of claim 12 wherein said electrical connecting device includes an upper longitudinal peripheral surface and a lower longitudinal peripheral surface, and said electrical connectors extending therebetween, and at least a first and second break-away portion each extending in said first direction and intersecting said plurality of electrical connectors in the vicinity of said upper and lower longitudinal perripheral surface, respectively, and further including the step of breaking off said upper and lower longitudinal peripheral surfaces from said plurality of electrical connectors after said welding step.

15. The method of claim 12 wherein said electrical connecting device includes an upper longitudinal peripheral surface and a lower longitudinal peripheral surface, and said electrical connectors extend therebetween, and at least a first and second break-away portion each extending in said first direction and intersecting said plurality of electrical connectors in the vicinity of said upper and lower longitudinal peripheral surface, respectively, and further including the step of breaking off said upper and lower longitudinal peripheral surfaces from said plurality of electrical connectors after said welding step.

* * * * *